United States Patent [19]

Birkle et al.

[11] Patent Number: 5,039,358
[45] Date of Patent: Aug. 13, 1991

[54] AMORPHOUS, HYDROGENATED CARBON ELECTROACTIVE PASSIVATION LAYER

[75] Inventors: Siegfried Birkle, Hoechstadt A/Aisch; Johann Kammermaier, Unterhaching; Gerhard Schmidt, Forchheim; Albrecht Winnacker, Erlangen, all of Fed. Rep. of Germany

[73] Assignee: Siemens Aktiengesellschaft, Berlin & Munich, Fed. Rep. of Germany

[21] Appl. No.: 473,577

[22] Filed: Feb. 1, 1990

[30] Foreign Application Priority Data

Feb. 1, 1989 [DE] Fed. Rep. of Germany ....... 3902970

[51] Int. Cl.$^5$ .................... H01L 21/00; H01L 21/02; B05D 3/00; B05D 3/06
[52] U.S. Cl. ................................ 148/33.3; 437/101; 437/225; 437/228; 357/2; 357/52
[58] Field of Search ................... 357/2, 52, 17, 30, 59; 437/101, 225, 228; 427/38, 39; 430/57, 65, 66, 67, 86; 148/33.3

[56] References Cited

U.S. PATENT DOCUMENTS

| | | | |
|---|---|---|---|
| 4,060,660 | 11/1977 | Carlson et al. | 428/408 |
| 4,254,426 | 3/1981 | Pankove | 357/2 |
| 4,322,452 | 3/1982 | Krausse et al. | 427/82 |
| 4,337,443 | 6/1982 | Umeda et al. | 357/52 |
| 4,569,738 | 2/1986 | Kieser et al. | 427/38 |
| 4,673,589 | 6/1987 | Standley | 427/41 |
| 4,675,265 | 6/1987 | Kazama et al. | 430/67 |
| 4,695,859 | 9/1987 | Guha et al. | 357/2 |
| 4,737,429 | 4/1988 | Mort et al. | 357/2 |
| 4,742,384 | 5/1988 | Pankove et al. | 357/52 |
| 4,756,964 | 7/1988 | Kincaid et al. | 427/40 |
| 4,760,005 | 7/1988 | Pai | 430/65 |
| 4,873,115 | 10/1989 | Matsumura et al. | 427/39 |

FOREIGN PATENT DOCUMENTS

| | | |
|---|---|---|
| 0284218 | 9/1988 | European Pat. Off. |
| 3610076A | 10/1986 | Fed. Rep. of Germany |
| 0055077 | 3/1984 | Japan |
| 0219961 | 9/1986 | Japan |
| 0152178 | 6/1988 | Japan |
| 0210268 | 8/1988 | Japan |
| 0246283 | 10/1988 | Japan |

OTHER PUBLICATIONS

Tamahashi, K., Investigation of Passivation Films for a-Si:H Photoreceptors (III)-Properties of a-c Films, Electrophotography, vol. 27, No. 1, pp. 24-30, 1/88.

Zhang, F., IR and ESR Studies of the Structural Properties of Hydrogenated Amorphous Carbon Films, vol. 109, No. 1, Sept. 1988, Phys. Stat. Solidi A (E. Germany), pp. 39-44.

Gonzalez-Hernandez, Jr., Spin Defects and Recombination in Hydrogenated Amorphous Carbon Films, Solid State Commun. (USA), vol. 67, No. 11, pp. 1085-1088, Sept. 1988.

O'Reilly, E., The Electronic Structure of Amorphous Carbon, J. Non-Cryst. Solids (Netherlands), vol. 97-98, pt. 2, pp. 1095-1102, Dec. 1987.

Robertson, J., Electronic and Atomic Structure of Amorphous Carbon, Phys. Rev. B, (USA), vol. 35, No. 6, pp. 2946-2957, Feb. 1987.

Robertson, J., Amorphous Carbon, Adv. Phys. (GB), vol. 35, No. 4, pp. 317-374, Jul. 1986.

Jones, D., Electrical and Optical Properties of Hydrogenated Amorphous Carbon, J. Phys. Colloq. (France), vol. 42, No. C-4, pt. 2, pp. 1085-1088, Oct. 1981.

Demichelis, F., Investigation on Physical Properties and Structure of Amorphous Hydrogenated Carbon Films, J. Non-Cryst. Solids (Netherlands), vol. 101, Nos. 2-3, pp. 179-186, May 1988.

Meyerson, B., Hydrogenated Amorphous Carbon (a-C:H), an Overview, Mater. Res. Soc., XVII+463, pp. 191-198, 1986.

"Magnetic Recording Medium and Its Manufacture", Patent Abstracts of Japan Publication No. 61054036.

IDR-Industrie Diamanten Rundschau, Bd. 18 (1984), Nr. 4, S. 249-253.

Primary Examiner—Brian E. Hearn
Assistant Examiner—B. Everhart
Attorney, Agent, or Firm—Kenyon & Kenyon

[57] ABSTRACT

The invention provides electroactive passivation layers for semiconductor components comprising a thin layer of amorphous, hydrogenated carbon.

14 Claims, No Drawings

AMORPHOUS, HYDROGENATED CARBON ELECTROACTIVE PASSIVATION LAYER

BACKGROUND OF THE INVENTION

1. Field of the Invention

The invention relates to an electroactive passivation layer for semiconductor components as well as to a method for its manufacture.

2. Description of Related Art

Discrete and integrated semiconductor components, particularly those used in MOS [metal oxide semiconductor] technology, are sensitive to disturbances caused by surface charges and therefore require, especially at the locations where p-n junctions appear at the surface, semiconductive electroactive passivation and protective layers. The following is required for such passivation layers:

(1) A favorable, electrical coupling of the layer to n- and p-conducting active substrates must be possible without any blocking layer effects. In other words, small barriers and consequently high blocking currents (ohmic contacts) must be present. This requirement means a high defect concentration in the band gap and a sufficiently intrinsic conductivity provided by a hopping mechanism or an optical mobility gap of between 1.1 and 1.4 eV, allowing a sufficient number of charge carriers to be generated thermally.

(2) The electrical conductivity (at room temperature) must lie below $10^{-8} \Omega^{-1}.cm^{-1}$, so that parasitic surface currents remain smaller than blocking currents between p- and n- conducting areas of the semiconductor to be protected.

(3) An adequate screening effect must be provided to protect the n- and p-conducting parts of the semiconductor. For this purpose,—besides a high density of rechargeable states (up to several $10^{19}$ cm$^{-3}$.eV$^{-1}$)—the protective and passivation layers must above all exhibit a low draft mobility of the charges.

(4) The passivation layers must be free of pinholes, have a low permeation coefficient for hydrogen and water, as well as offer mechanical and moisture protection.

(5) When the semiconductor components are heated—in the production process—to 290° C., the passivation layers must not give off hydrogen.

Layers made of amorphous silicon (a-Si) are currently used as electroactive passivation layers for semiconductor components. These layers can be grown on the semiconductor components, however, the silicon can also be vapor-deposited, whereby the vapor-deposited layer is then tempered (see U.S. Pat. No. 4,322,452. The passivation layers can contain dopants, such as boron, phosphorus and aluminum, which allow the specific electrical resistance to be adjusted.

Electroactive passivation layers made of a-Si do contain a sufficient amount of defect (hole) states in the band gap. The required resistance value of about $10^8$ $\Omega.cm$ can be adjusted through the deposition and sintering conditions, and doping only has a weak effect due to the high density of states. A serious disadvantage with these layers, however, is that their ability to be coupled to p-conductive substrates is considerably less than their ability to be coupled to n-conductive substrates. This can lead to surface openings on pn-junctions with high-blocking capability. Also, in the case of a-Si layers, the optical mobility gap can hardly be varied and thus cannot be adapted to any arbitrary active substrates. These layers are also particularly disadvantageous because of their lack of stability vis-a-vis moisture, ion diffusion, and mechanical influences.

SUMMARY OF THE INVENTION

The object of the invention is to provide a semiconductive electroactive passivation layer for semiconductor components, which, in addition to having a high defect concentration in the band gap, a sufficiently low electrical conductivity and the required optical mobility gap, also exhibits a good stability vis-a-vis moisture, ion diffusion and mechanical influences, and is able to be efficiently coupled both to p-conductive as well as to n-conductive substrates. This object is achieved according to the invention in that the passivation layer is a thin layer of amorphous, hydrogenated carbon (a-C:H).

DETAILED DESCRIPTION OF THE INVENTION

Amorphous, hydrogenated carbon (in short a-C:H) is a carbon material, in which an amorphous carbon network-type structure exists. Due to its mechanical hardness, this carbon material is also described as a diamond-like carbon (see for example: "IDR—Industrie Diamanten Rundschau [Industrial Diamond Magazine]", volume 18 (1984), no. 4, pages 249 ff.). The special properties of this amorphous modification of carbon such as optical transparency, microhardness, chemical resistance and electrical insulation are attributable to the juxtaposition of tetrahedral (sp$^3$-) and trigonal (sp$^2$-) hybridization, as well as to the incorporation of hydrogen (approximately 10 to 40 atomic percentage).

The passivation layer according to the invention in the form of a-C:H thin layers, which preferably exhibit a thickness of approximately between 0.05 and 3 $\mu$m, fulfills all requirements resulting from the electroactive passivation of semiconductor components sensitive to surface charges. Unlike a-Si, a-C:H can be produced, by varying the conditions of its manufacture, with different optical mobility gap, a variable defect concentration and a variable electrical resistance without requiring doping processes. Thus, with the a-C:H layers it is possible to simultaneously and optimally achieve the following values: defect concentration of approximately $10^{19}$ cm$^{-3}$.eV$^{-1}$; electrical conductivity $<10^{-8}$ $\Omega^{-1}.cm^{-1}$; optical mobility gap of approximately 1.1 eV.

In accordance with the invention, the electroactive passivation layer is produced by applying a thin layer of amorphous, hydrogenated carbon to a substrate by means of a high-frequency, low pressure plasma deposition of gaseous hydrocarbons. The plasma deposition advantageously takes place thereby with the assistance of radio frequency (RF) in the range between 0.1 and 100 MHz. The deposition can also take place with the assistance of microwaves (MW) in the range between 0.1 and 1000 GHz.

In the manufacturing of the passivation layer according to the invention, alkanes are preferably used as gaseous hydrocarbons (i.e., saturated aliphatic hydrocarbons, such as methane, ethane and propane), whereby methane is preferred. In addition, however, alkenes, that is unsaturated aliphatic hydrocarbons, such as ethene and propene, can be used, as well as acetylene, cycloalkanes, that is saturated cyclic hydrocarbons, such as cyclohexane, and—in the vaporous state—aromatic hydrocarbons in the form of benzene and benzene derivatives. The hydrocarbons of the type mentioned can be employed individually or as a mixture. Also, one can add hydrogen and/or noble gases, such as helium and argon, to the hydrocarbons.

In high-frequency discharges, in particular with RF excitation, a dc voltage component (biasing voltage or "self bias potential" of up to approximately 1 kV, which pulsates in step with the high frequency, develops—because of space charges—in the case where the internal electrodes of the discharge device vary in size (surface ratio $\leq 0.5$, preferably between 0.25 and 0.05). This dc voltage component superimposes the high-frequency ac voltage and turns the smaller electrode into a cathode. In this manner, the charged $C_XH_Y$ particles, which develop as the result of ionization and fragmentation of the reaction gas, are accelerated toward the cathode and are deposited with high kinetic energy on the substrate arranged in front of the cathode—with the formation of a-C:H. A "self-bias" effect of the previously mentioned type is effective, although to a much lesser degree—due to the lack of internal electrodes—even in MW-induced deposition plasmas, because a potential difference exists in any case between the plasma and the substrate surface.

a-C:H can be produced with different properties by varying the conditions of the plasma deposition. The variable conditions are the frequency of the high-frequency discharge, the energy density supplied to the plasma, the configuration and size of the electrodes, the gas pressure (that is the partial pressure of the reaction gas), the gas flow rate (or the mass flow rate) and the temperature of the substrate ($\geq 250°$ C.). All of these parameters can be adjusted independently from each other, so that the properties of the a-C:H layers can be selectively controlled.

The invention shall be explained in greater detail based on the following exemplified embodiment.

Methane $CH_4$ (as a reaction gas) is laterally introduced at a pressure of 100 Pa into an apparatus, in the form of a cylindrical glass vessel, used for plasma deposition of a-C:H by means of RF-excitation. Via a narrow annular clearance, the reaction gas attains the plasma having a volume of approximately 45 cm$^3$ and developing between two unequal, planar electrodes (surface relation 1:2). Both electrodes are connected to a RF-generator ($\nu = 13.56$ MHz). Due to the fact that the electrodes are unequal, a self-bias dc voltage develops between them, which voltage superimposes the RF-voltage. Thereby the smaller electrode, which supports the substrates to be coated, becomes a cathode.

At a high-frequency power density of approximately 14 W.cm$^{-2}$ relative to the cathode surface, a self-bias dc voltage of approximately 800 V develops between the two electrodes. Under these conditions, with a $CH_4$ mass flow rate of $5 \times 10^4$ Pa.cm$^3$.s$^{-1}$ one obtains after 2½ min. (deposition rate: approximately 7 nm.s$^{-1}$ an approximately 1 $\mu$m thick a-C:H layer with a specific electrical resistance of $>10^8$ $\Omega$.cm at room temperature and an optical mobility gap of approximately 1.1 eV. The defect concentration in the Fermi level in the case of this a-C:H layer is approximately $10^{19}$ cm$^{-3}$.eV$^{-1}$.

What is claimed is:

1. An electroactive passivation layer for semiconductor components comprising a thin layer of amorphous, hydrogenated carbon (a-C:H) having a defect concentration of approximately $10^{19}$ cm$^{-3}$.eV$^{-1}$, a specific electrical resistance of $>10^8$ $\Omega$.cm, and an optical mobility gap of approximately 1.1 eV.

2. The passivation layer according to claim 1 wherein said layer has a thickness of about 0.05 $\mu$m to about 3 $\mu$m.

3. A method for manufacturing an electroactive passivation layer for semiconductor components comprising the step of applying a thin layer of amorphous, hydrogenated carbon to a substrate by means of a high-frequency, low-pressure plasma deposition of at least one gaseous hydrocarbon, said layer having a defect concentration of approximately $10^{19}$ cm$^{-3}$.eV$^{-1}$, a specific electrical resistance of $>10^8$ $\Omega$.cm, and an optical mobility gap of approximately 1.1 eV.

4. The method according to claim 3 wherein the plasma deposition is accomplished by means of radio frequency.

5. The method according to claim 3 wherein an alkane is used as gaseous hydrocarbon.

6. The method according to claim 5 wherein methane is used as gaseous hydrocarbon.

7. The method according to claim 3 wherein the substrate is maintained at a temperature of $\geq 250°$ during the deposition process.

8. The method according to claim 4 wherein an alkane is used as gaseous hydrocarbon.

9. The method according to claim 4 wherein the substrate is maintained at a temperature of $\geq 250°$ C. during the deposition process.

10. The method according to claim 5 wherein the substrate is maintained at a temperature of $\geq 250°$ C. during the deposition process.

11. The method according to claim 3 wherein said layer has a thickness of about 0.05 $\mu$m to about 3 $\mu$m.

12. The method according to claim 4 wherein said layer has a thickness of about 0.05 $\mu$m to about 3 $\mu$m.

13. The method according to claim 5 wherein said layer has a thickness of about 0.05 $\mu$m to about 3 $\mu$m.

14. The method according to claim 7 wherein said layer has a thickness of about 0.05 $\mu$m to about 3 $\mu$m.

* * * * *